United States Patent [19]
Schilling et al.

[11] Patent Number: 4,748,421
[45] Date of Patent: May 31, 1988

[54] ENHANCED CLASS SM POWER AMPLIFIER

[75] Inventors: Donald L. Schilling, Sands Point; David Manela, Kew Garden; Tuvia Apelewicz, Queens, all of N.Y.

[73] Assignee: SCS Telecom, Inc., Port Washington, N.Y.

[21] Appl. No.: 35,917

[22] Filed: Apr. 8, 1987

[51] Int. Cl.$^4$ .............................................. H03F 3/217
[52] U.S. Cl. ................................ 330/251; 330/207 A
[58] Field of Search ................... 330/10, 207 A, 251, 330/277

[56] References Cited

U.S. PATENT DOCUMENTS 4,554,512 11/1985 Aiello ............................ 330/251 X
4,594,560 6/1986 Dingwall et al. ............... 330/277 X Primary Examiner—Eugene R. Laroche
Assistant Examiner—Steven J. Mottola
Attorney, Agent, or Firm—David B. Newman, Jr.

[57] ABSTRACT

A class SM amplifier is provided having a threshold circuit with a plurality of threshold levels for generating a plurality of threshold signals. In response to an input signal passing a particular threshold level, the threshold circuit generates as an output a particular threshold signal. A voltage supply is provided having a plurality of voltage levels. The class SM amplifier includes a plurality of transistors coupled to a power combiner and the threshold circuit, and the plurality of voltage levels from the voltage supply. The transistors switch voltage levels across the power combiner in response to a particular threshold signal from the threshold circuit. The power combiner is coupled to a load, and outputs the combination of the voltages from the transistors across the load. The plurality of voltage levels are adjusted to approximate the input signal.

11 Claims, 6 Drawing Sheets

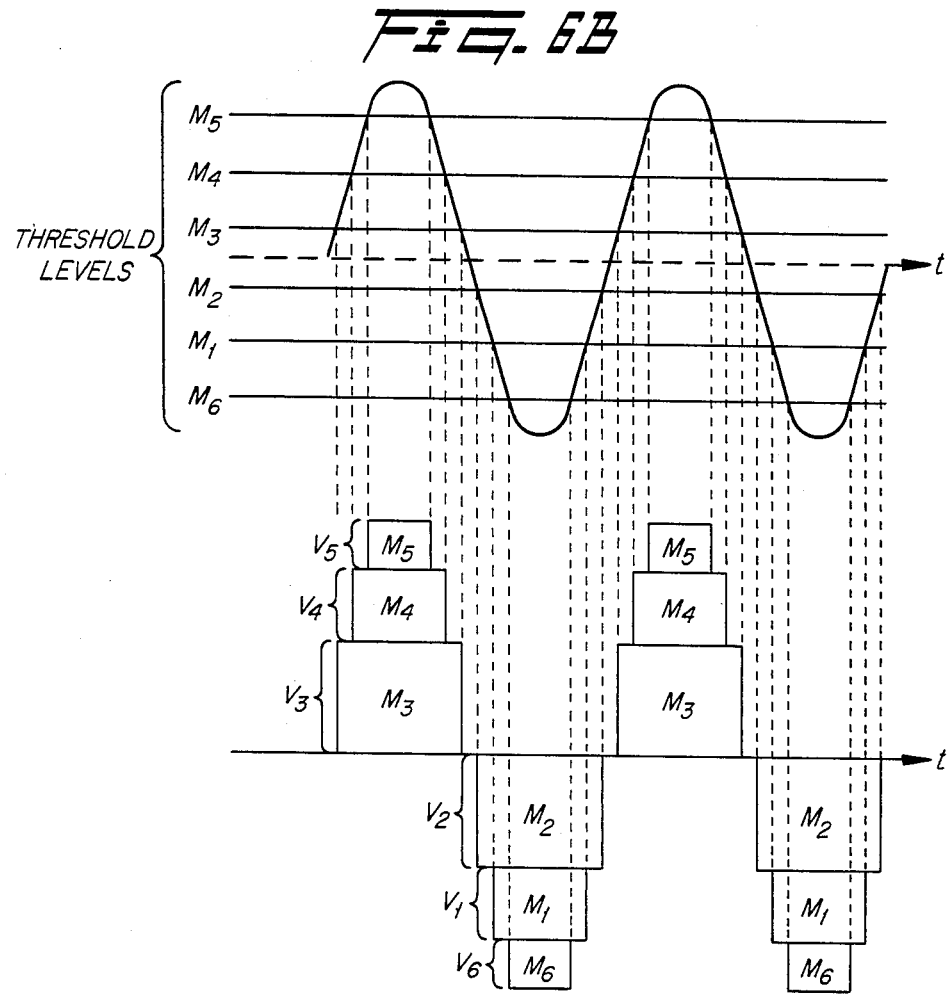
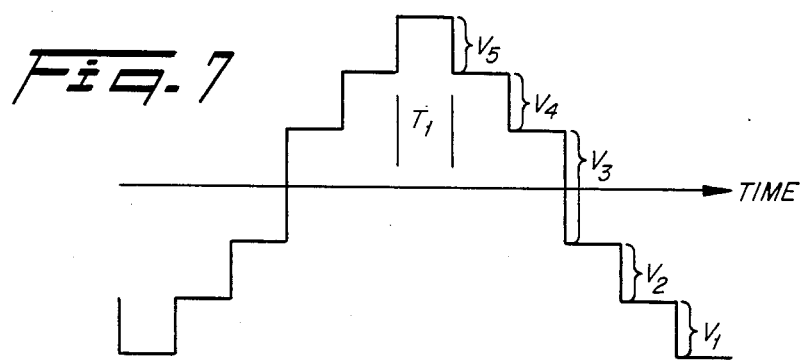

ENHANCED CLASS SM POWER AMPLIFIER

BACKGROUND OF THE INVENTION

This invention relates to amplifying signals at high frequency and at high power, with minimal spectral pollution.

DESCRIPTION OF THE PRIOR ART

Class D amplifiers are well known in the prior art for amplifying signals at high power and high frequencies. As shown in FIG. 1a, the class D amplifier comprises two transistors, transistor $S_1$ and $S_2$. Transistors $S_1$ and $S_2$ may represent a group of transistors containing more than one transistor. In operation, the transistors in the class D amplifier are switched from saturation to cutoff. Each group of transistors acts like a switch as shown in FIG. 1b. When $S_1$ is closed, $S_2$ is open, and vice versa. The input signal to be amplified contains sufficient voltage to turn the transistors on and off. The resulting waveform presented to the load $R_L$ is shown in FIG. 2. Note that the input signal is a low power signal since the gate of a field effect transistor (FET), or the base of a bipolar junction transistor (BJT), accepts very low currents. As a result of the switching action of $S_1$ and $S_2$, the supply voltages, $+V$ and $-V$, are alternately switched across the load. If the switching is done instantaneously little power is dissipated in the transistors. The power which is dissipated in the transistors is due to the rise and fall times of the transistors, the input and output capacitance of the transistors which limit their switching speed, and also to the saturation resistance of the transistor switch which directly causes dissipation even when the transistor is saturated. These effects cannot be avoided.

In the prior art, there are two other fundamental problems with the class D amplifier configuration which are produced as a result of the square-wave nature of the output of the class D amplifier. First, the efficiency of the operation is poor since a significant portion of the signal is not at the desired frequency $f_o$ but is at harmonics of $f_o$. Thus, the power dissipated in the load $R_L$ due to the signal component at frequency $f_o$ is much less than the power supplied by the supply voltages. Second, the harmonics occur at the frequencies $2f_o$, $3f_o$ and all other harmonics of $f_o$, and these harmonics pollute the spectrum.

OBJECTS AND SUMMARY OF THE INVENTION

An object of the present invention is to provide an amplifier for operating at high frequencies and for delivering a high power to a load.

Another object of the present invention is to provide an amplifier having little power dissipation.

A further object of the present invention is to provide an amplifier having minimal spectral pollution.

An additional advantage of the present invention is to provide an amplifier requiring a low voltage across each switching means and having switching means on for a long time duration for efficient operation.

According to the present invention, as embodied and broadly described herein, an apparatus for amplifying signals is provided comprising a load, a power combiner, an input source, and threshold means having more than one threshold level, for generating first, second, and third threshold signals, respectively. Also included are voltage means, and first, second, third and fourth switching means coupled to the power combiner, voltage means and threshold means. The threshold means, voltage means, and first, second, third and fourth switching means may be embodied as a threshold circuit, voltage supply, and a plurality of switching means including at least first, second, third, and fourth transistors, respectively. The input source can have an input signal with a bandwidth and a center frequency. The threshold circuit is coupled to the input source. The voltage supply supplies first, second, third and fourth voltage levels to the first, second, third and fourth transistors, respectively. The first, second, third and fourth voltage levels normally are adjusted to approximate the input signal. Further, the first, second, third, and fourth transistors are responsive to the first, second, third and fourth threshold signals from the threshold circuit for switching first, second, third, and fourth voltage levels across the power combiner. The power combiner outputs across the load a combination of the first, second, third or fourth voltage levels applied across the inputs of the power combiner.

Additional objects and advantages of the invention will be set forth in part in the description which follows, and in part will be obvious from the description, or may be learned by practice of the invention.

BRIEF DESCRIPTION OF THE DRAWINGS

The accompanying drawings, which are incorporated in and constitute a part of this specification, illustrate a preferred embodiment of the invention, and together with the description, serve to explain the principles of the invention.

FIG. 6B illustrates a second approximation of a sinusoidal type signal using the class SM amplifier of FIG. 6A; and FIG. 7 illustrates how voltage and time both can be varied to approximate the sinusoidal type waveform.

DETAILED DESCRIPTION OF THE PREFERRED EMBODIMENTS

Reference will now be made in detail to the present preferred embodiments of the invention, examples of which are illustrated in the accompanying drawings.

Figure 1A:
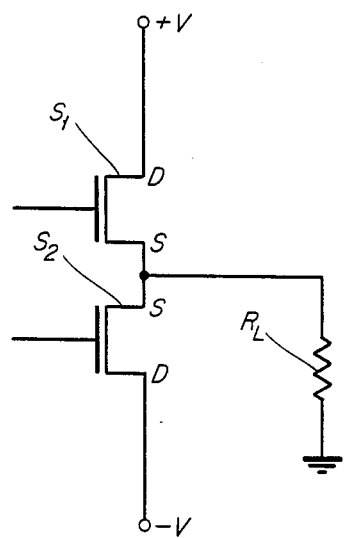
FIG. 1 is a block diagram of a prior art class D amplifier with a model of the class D amplifier as a switch.
Figure 1B:
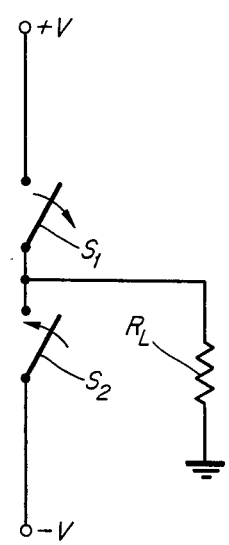
Figure 2:
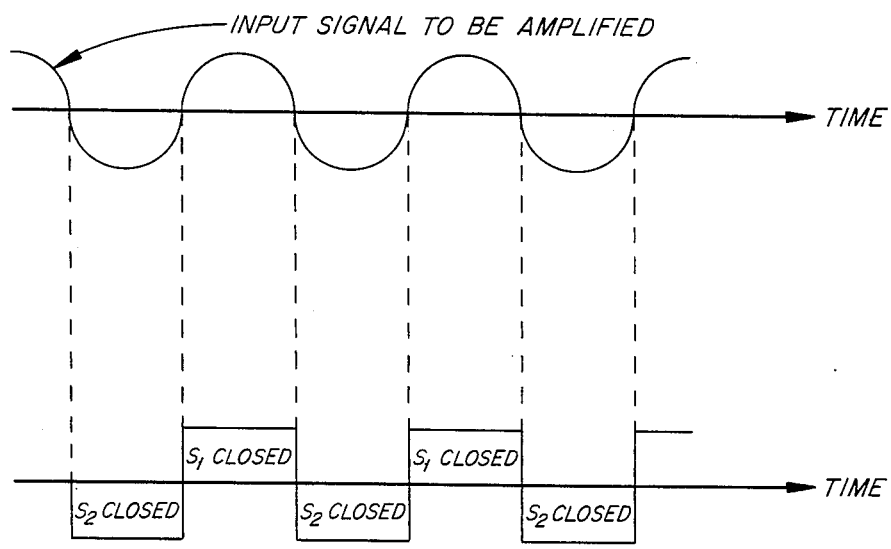
FIG. 2 illustrates an approximation of a sinusoid using a class D amplifier.
Figure 3:
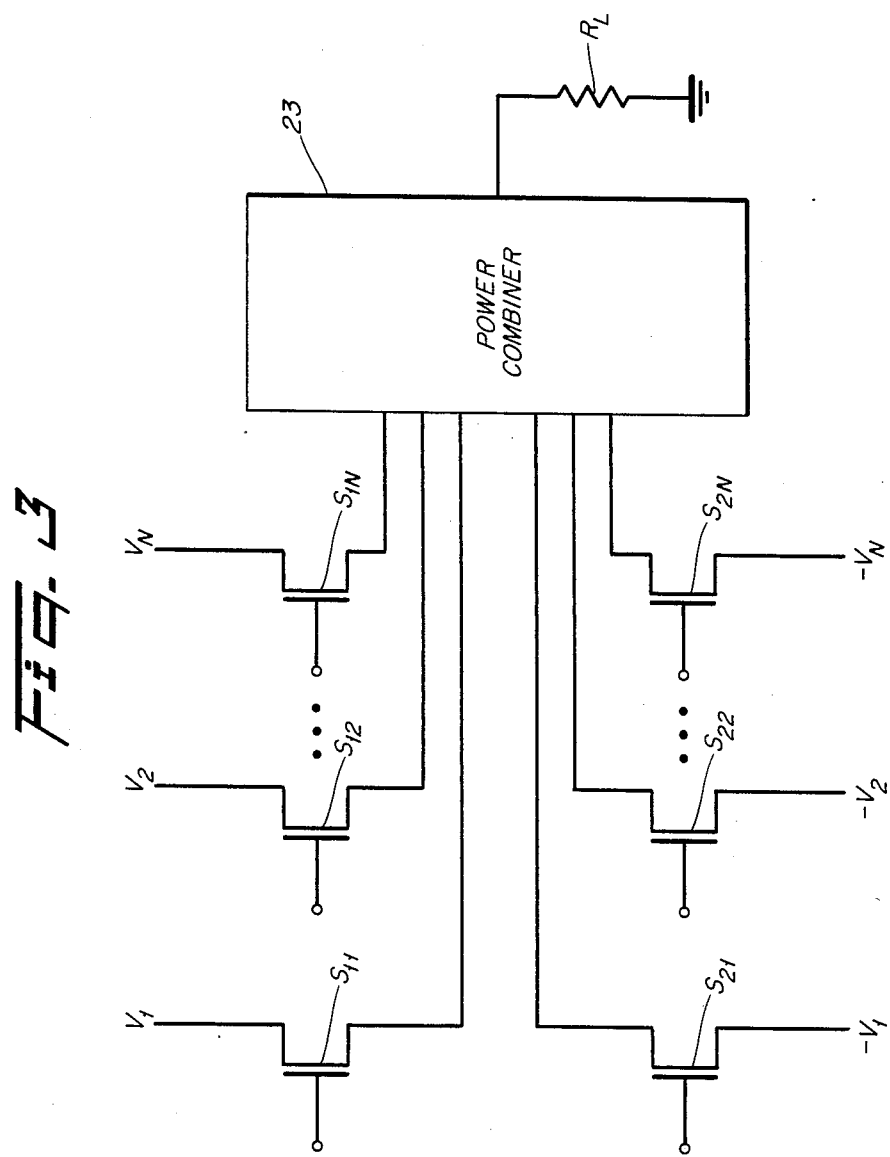
FIG. 3 is a schematic diagram of the class SM amplifier employing N transistors of the present invention.

FIG. 3 broadly illustrates the class SM amplifier. In this particular embodiment, the class SM amplifier comprises N groups of pairs of transistors coupled to a power combiner 23. Each transistor, in each pair, may in practice contain K transistors in parallel, such that 2KN transistors are required. Also, 2N supply voltages are required.

Figure 4:
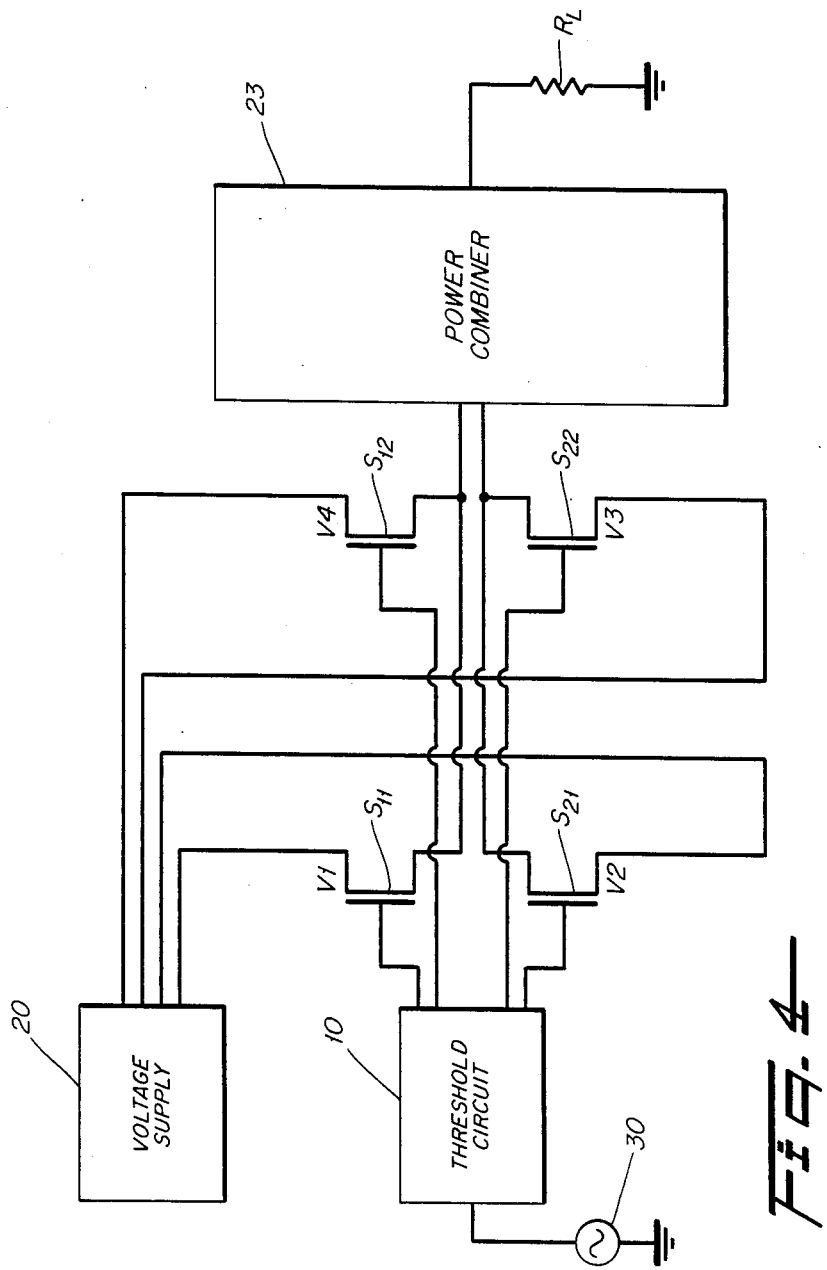
FIG. 4 illustrates a particular transistor configuration of the class SM amplifier of the present invention.

Referring to FIG. 4, a first preferred embodiment of a class SM amplifier is shown comprising a load, $R_L$, a power combiner 23 coupled to the load $R_L$, an input signal source 30, threshold means coupled to the input signal source 30 and voltage means for supplying a first voltage level, V1, a second voltage level, V2, a third voltage level, V3, and a fourth voltage level, V4. Also included are first, second, third and fourth switching means coupled to the threshold means. The threshold means may be embodied as threshold circuit 10. Voltage means may be embodied as voltage supply 20. First, second, third and fourth switching means may be embodied as first, second, third and fourth transistors $S_{11}$, $S_{12}$, $S_{22}$, $S_{21}$. The input signal source 30 supplies an input signal with a bandwidth B and a center frequency $f_o$. The input signal typically might be a frequency modulated, FM, or phase modulated, PM, signal.

The threshold circuit 10 includes first, second, third, and fourth threshold levels. In response to an input signal from the input source 30 crossing the first, second, third or fourth threshold level, the threshold circuit 10 generates first, second, third or fourth threshold signal, respectively.

The first transistor $S_{11}$ is coupled to the power combiner 23, the voltage supply 20, and the threshold circuit 10. The second transistor $S_{12}$ is coupled to the power combiner 23, the voltage supply 20, and the threshold circuit 10. The third transistor $S_{22}$ is coupled to the power combiner 23, the voltage supply 20, and the threshold circuit 10. The fourth transistor $S_{21}$ is coupled to the power combiner 23, the voltage supply 20, and the threshold circuit 10. In general, the first, second, third and fourth transistors $S_{11}$, $S_{12}$, $S_{21}$ must be connected to a power combiner 23. The power combiner 23 is connected to the load $R_L$. In principle the power combiner 23 could be connected to filters and accordingly through filters or other coupling mechanisms to the load $R_L$. Power combiners are well known in the art, in their use and design.

The voltage supply 20 is coupled to the first, second, third and fourth transistors, $S_{11}$, $S_{12}$, $S_{22}$, $S_{21}$ and supplies a first voltage level, V1, a second voltage level, V2, a third voltage level, V3, and a fourth voltage level, V4 to the first, second, third and fourth transistors, $S_{11}$, $S_{12}$, $S_{22}$ and $S_{21}$. Voltage supply 20 continuously supplies voltage to the transistors. When a transistor is activated by having threshold circuit 10 apply voltage to, for example, a base or gate of a particular transistor, current flows through the transistor to the power combiner 23. The power combiner 23 outputs across the load $R_L$ a combination of the voltage levels applied across the input of the power combiner 23.

First, second, third and fourth transistors $S_{11}$, $S_{12}$, $S_{22}$ and $S_{21}$ are responsive to the first, second, third and fourth threshold signals from threshold circuit 10, respectively. First, second, third and fourth threshold signals may be, for example, a voltage applied to the base or gate of a transistor.

Figure 5:
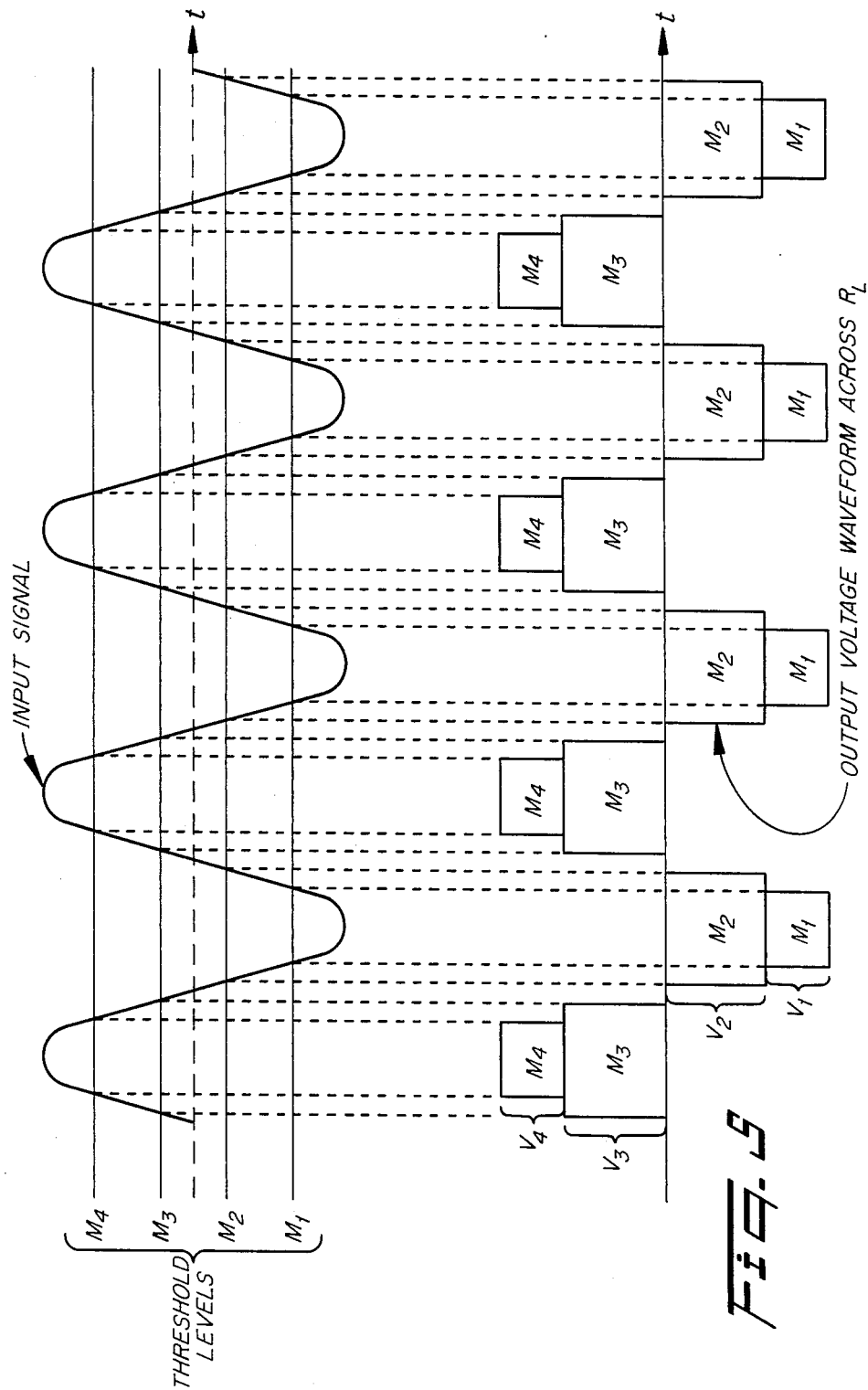
FIG. 5 shows an input signal having a sinusoidal waveform and output signal with respect to threshold levels.

FIG. 5 shows a particular relationship of the input signal, output signal, and first, second, third and fourth threshold levels. In response to the input signal from input source 30 being above third threshold level, M3, threshold circuit 10 generates the third threshold signal which activates third transistor $S_{22}$, thereby causing current to flow through third transistor $S_{22}$ and through the third input of power combiner 23. Accordingly, since no other voltages are across any of the inputs of the power combiner 23, the power combiner 23 outputs the third voltage level V3 across the load $R_L$.

In response to the input signal from input source 30 being above fourth threshold level, M4, threshold circuit 10 generates the fourth threshold signal which activates fourth transistor $S_{21}$, thereby causing current to flow through fourth transistor $S_{12}$ and through the fourth input of power combiner 23. Since the input signal from input source 30 also is above the third threshold M3, threshold circuit 10 continues to generate the third threshold signal, thereby activating third transistor $S_{22}$, continuing to cause the third voltage level V3 to appear across the third input of the power combiner 23. Accordingly, the power combiner 23 outputs to the load $R_L$ the combination of the voltages across the third and fourth inputs of the power combiner 23. Thus, a total voltage including third voltage level V3 plus fourth voltage level V4 appears across the load $R_L$.

In response to an input signal from input source 30 being below second threshold level, M2, and above first threshold level, M1, threshold circuit 10 generates the second threshold signal which activates second transistor $S_{12}$, thereby causing current to flow through second transistor $S_{12}$ and through power combiner 23. Accordingly, since no other voltage levels appear across the other inputs of the power combiner 23, the power combiner 23 outputs the second voltage level V2 across load $R_L$.

In response to an input signal from input source 30 being below first threshold level, M1, threshold circuit 10 generates the first threshold signal which activates first transistor $S_{11}$, thereby causing current to flow through first transistor $S_{11}$ and through the first input of power combiner 23. Accordingly, the first voltage level V1 appears across the first input of power combiner 23. Since the input signal from input source 30 also is below the second threshold M2, threshold circuit 10 continues to generate the second threshold signal, thereby activating second transistor $S_{12}$, continuing to cause the second voltage level V2 to appear across the second input of the power combiner 23. Accordingly, the power combiner 23 outputs to the load $R_L$ the combination of the voltages across the first and second inputs of the power combiner 23. Thus, a total voltage including first voltage level V1 plus second voltage level V2 appears across the load $R_L$.

Thus, in response to first, second, third and fourth transistors $S_{11}$, $S_{12}$, $S_{22}$, $S_{21}$ being activated by threshold circuit 20, voltage supply 20 supplies a first voltage level, V1, to the first input of the power combiner 23 via the first transistor $S_{11}$, a second voltage level, V2, to the second input of the power combiner 23 via the second transistor $S_{12}$, a third voltage level, V3, to the third input of the power combiner 23 via the third transistor $S_{22}$, and a fourth voltage level, V4, to the fourth input of the power combiner 23 via the fourth transistor $S_{12}$. The power combiner 23 outputs to the load, $R_L$, the combination of the voltage levels across the inputs of the power combiner 23. The first, second, third and fourth voltage levels may be adjusted to approximate the input signal.

In operation, the class SM amplifier uses first, second, third and fourth transistors $S_{11}$, $S_{12}$, $S_{22}$, and $S_{21}$, as switches to connect a prescribed voltage level across the first, second, third and fourth inputs, respectively, of the power combiner 23 in response to the input signal being near a particular threshold level. The voltage levels for first, second, third and fourth transistors $S_{11}$, $S_{12}$, $S_{22}$, $S_{21}$ are each selected so that the resulting waveform across the load approximates the sinusoidal amplitude near the center frequency of the input signal.

As illustrated in FIG. 5, the threshold circuit 10 can have a fifth range for when the input signal from input source 30 is between second and third threshold levels, M2, M3, and threshold circuit 10 does not generate any threshold signal. In this range, no current flows through any of the transistors, the inputs of the power combiner 23, and load $R_L$. Accordingly, zero voltage appears across load $R_L$.

Figure 6A:
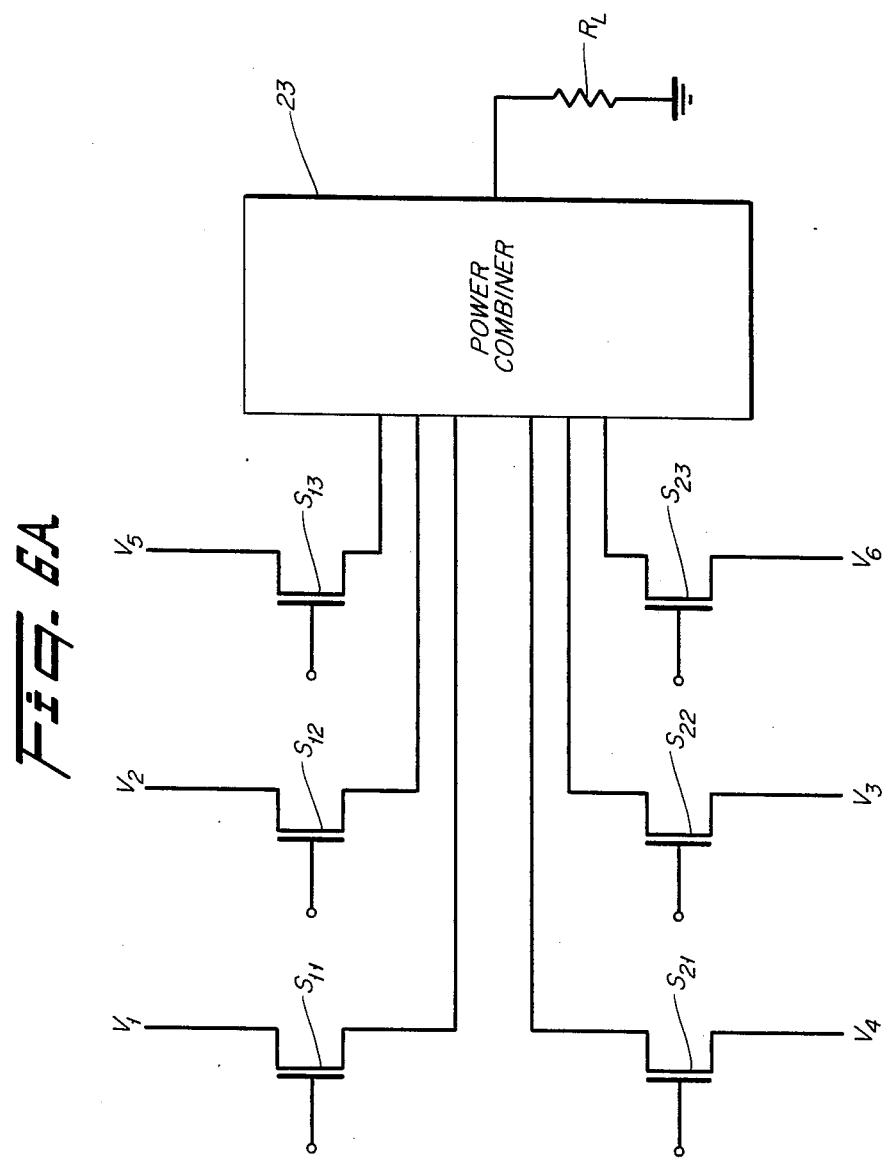
FIG. 6A illustrates a second particular transistor configuration of the class SM amplifier of the present invention.

As shown in FIG. 6A, the class SM amplifier may include a fifth and sixth transistor $S_{13}$, $S_{23}$. In this particular embodiment, voltage supply 20 would supply fifth and sixth voltage levels V5, V6, to the fifth and sixth transistor $S_{13}$, $S_{23}$. Also, the threshold circuit 10 would have fifth and sixth threshold levels, M5, M6. Thus, in response to the input signal from input source 30 crossing the fifth threshold level, M5, threshold circuit 10 generates the fifth threshold signal which activates fifth transistor $S_{13}$, thereby causing current to flow through fifth transistor $S_{13}$ and through a fifth input of power combiner 23. Accordingly, the fifth voltage level V5 appears across the fifth input of the power combiner 23. Since the input signal from input source 30 also is above the third and fourth thresholds M3, M4, threshold circuit 10 continues to generate the third and fourth threshold signals, thereby activating third and fourth transistors $S_{22}$, $S_{21}$, continuing to cause the third and fourth voltage levels V3, V4 to appear across the third and fourth inputs of the power combiner 23. Accordingly, the power combiner 23 outputs to the load $R_L$ the combination of the voltage across the third, fourth and fifth inputs of the power combiner 23. Thus, a total voltage including third voltage level V3 plus fourth voltage level V4 plus the fifth voltage level V5 appears across the load $R_L$.

In response to the input signal from input source 30 crossing the sixth threshold level, M6, threshold circuit 10 generates the sixth threshold signal which activates sixth transistor $S_{23}$, thereby causing current to flow through sixth transistor $S_{23}$ and through a sixth input to the power combiner 23. Accordingly, the sixth voltage level V6 appears across the sixth input of the power combinerwr 23. Since the input signal from input source 30 also is below the second and first thresholds M2 and M1, threshold circuit 10 continues to generate the second and first threshold signals, thereby activating second and first transistor $S_{12}$ $S_{11}$, continuing to cause the second and first voltage levels V2, V1 to appear across the second and first inputs of the power combiner 23. Accordingly, the power combiner 23 outputs to the load $R_L$ the combination of the voltages across the first, second and sixth inputs of the power combiner 23. Thus, a total voltage including first voltage level V1 plus second voltage level V2 plus sixth voltage level V6 appears across the load $R_L$.

As illustratively shown in FIG. 6A, first, second, third, fourth, fifth, and sixth transistors may be configured along with corresponding first, second, third, fourth, fifth and sixth voltages V1, V2, V3, V4, V5 and V6. This embodiment may be employed to generate an improved approximation of a sinusoidal type signal as shown in FIG. 6B. Further, additional transistors may be configured as was shown in FIG. 3 to even further improve the sinusoidal amplitude approximation.

In operation, the class SM amplifier is required to deliver an approximately sinusoidal current to the load. The closer the current resembles the input signal the smaller will be the amplitude of the signals at the harmonic frequencies in the frequency domain and the higher the amplifier efficiency becomes. Simultaneously, since each transistor operates as a switch, the power dissipation is minimized and is the same as for a class D amplifier. Accordingly, the class SM amplifier dissipates power similar to the class D amplifier; however, the class SM amplifier operates at significantly higher efficiency.

For the class SM amplifier in FIG. 3, the voltages $\pm V_1$, $\pm V_2$, ..., $\pm V_N$ and/or the durations of the interval during which a transistor is closed are set such that the net current into the load $R_L$ approximates a sinusoidal amplitude. FIGS. 4, 6, and 7 illustrate typical class SM amplifier approximations to the input signal having a sinusoidal amplitude. FIG. 5 shows voltage levels V1, V2, V3, V4, which are adjusted suitably to approximate a sinewave. While an "optimum" choice in voltage levels can be found to maximize efficiency, suboptimum values also can be used. FIG. 5 shows the approximation to the sinewave as first, second, third, and fourth transistors $S_{11}$, $S_{12}$, $S_{22}$, and $S_{21}$ are closed as a switch. In this particular embodiment, there are two intervals during which no switch is closed. Also, the duration of each interval is fixed. FIG. 6A is similar to FIG. 4; however, six voltage levels are supplied from the voltage supply. FIG. 7 shows that time duration and/or a voltage can be varied from that of FIG. 6A, to approximate the sinusoidal waveform. It is noted, however, that no one switch need always be closed during the timed intervals.

In the present invention it is important to approximate the input signal to provide efficient amplification and low spectral splatter in the output across load $R_L$. This can be accomplished by changing the duration and/or voltage, and how many voltages/time durations are used. Increasing the number of voltages, i.e., letting N increase in FIG. 3 and "optimally" adjusting the supply voltages will result in improved performance, achieving maximum efficiency.

The design of such an amplifier is similar to the class SM amplifier disclosed in U.S. patent application having Ser. No. 004,423, which is expressly incorporated herein by reference.

From the teachings of the present invention, it would be obvious that variations and extensions can be made from the claimed invention. For example, in a preferred embodiment, the number of transistors per switching element can be increased to handle increased power. Further, the total number of power supply voltages may be adjusted to improve the approximation of the input signal.

It will be apparent to those skilled in the art that various modifications can be made to the SM amplifier of the instant invention without departing from the scope or spirit of the invention, and it is intended that the present invention cover modifications and variations of the class SM amplifier provided they come within the scope of the appended claims and their equivalence.

We claim:

1. A class SM amplifier comprising:
    a load;
    a power combiner coupled to said load, having first, second, third and fourth inputs;
    an input source having an input signal with a bandwidth B and a center frequency $f_o$;
    threshold means having first, second, third and fourth threshold levels, coupled to said input source and responsive to the voltage amplitude of the input signal crossing first, second, third and fourth threshold levels, for generating first, second, third, and fourth threshold signals, respectively;

voltage means for supplying a first voltage level, V1, a second voltage level, V2, a third voltage level, V3, and a fourth voltage level V4, wherein first voltage level is adjusted to approximate the voltage amplitude of the input signal when the voltage amplitude of the input signal crosses the first threshold level, first voltage level plus second voltage level are adjusted to approximate the voltage amplitude of the input signal when the voltage amplitude of the input signal crosses the second threshold level, third voltage level is adjusted to approximate the voltage amplitude of the input signal when the voltage amplitude of the input signal crosses the third threshold level, and third voltage level plus fourth voltage level are adjusted to approximate the voltage amplitude of the input signal when the voltage amplitude of the input signal crosses the fourth threshold level;

first switching means coupled to said power combiner, said threshold means and the first voltage level of said voltage means, and responsive to the first threshold signal from said threshold means for switching the first voltage level across said power combiner;

second switching means coupled to said power combiner, said threshold means and the second voltage level of said voltage means, and responsive to the second threshold signal from said threshold means for switching the second voltage level across said power combiner;

third switching means coupled to said power combiner, said threshold means and the third voltage level of said voltage means, and responsive to the third threshold signal from said threshold means for switching the third voltage level across said power combiner;

fourth switching means coupled to said power combiner, said threshold means and the fourth voltage level of said voltage means, and responsive to the fourth threshold signal from said threshold means for switching the fourth voltage level across said power combiner; and wherein said power combiner is responsive to only the second voltage level being present at the second input for outputting the second voltage level across said load, is responsive to only the third voltage level being present at the third input for outputting the third voltage level across said load, is responsive to the first and second voltage levels being present simultaneously at the first and second inputs for outputting the combination of the first and second voltage levels across said load, and is responsive to the third and fourth voltage levels being present simultaneously at the third and fourth inputs for outputting the combination of the third and fourth voltage levels across said load.

2. A class SM amplifier comprising:
a load;
a power combiner coupled to said load;
an input source having an input signal with a bandwidth and a center frequency;
threshold means having a plurality of threshold levels including at least first, second, third and fourth threshold levels, coupled to said input source, and responsive to the voltage amplitude of the input signal crossing first, second, third and fourth threshold levels, for generating first, second, third and fourth threshold signals, respectively;

voltage means for supplying a plurality of voltage levels including at least first, second, third and fourth voltage levels, wherein first voltage level is adjusted to approximate the voltage amplitude of the input signal when the voltage amplitude of the input signal crosses the first threshold level, first voltage level plus second voltage level are adjusted to approximate the voltage amplitude of the input signal when the voltage amplitude of the input signal crosses the second threshold level, third voltage level is adjusted to approximate the voltage amplitude of the input signal when the voltage amplitude of the input signal crosses the third threshold level, third voltage level plus and fourth voltage level are adjusted to approximate the voltage amplitude of the input signal when the voltage amplitude of the input signal crosses the fourth threshold level;

a plurality of switching means including at least first, second, third, and fourth switching means coupled to said power combiner, said threshold means, and to the first, second, third and fourth voltage levels of said voltage means, respectively, wherein said first, second, third, and fourth switching means are responsive to the first, second, third and fourth threshold signals from said threshold means for switching first, second, third and fourth voltage levels of said voltage means, respectively, across said power combiner; and wherein said power combiner is responsive to only the second voltage level being present at the second input for outputting the second voltage level across said load, is responsive to only the third voltage level being present at the third input for outputting the third voltage level across said load, is responsive to the first and second voltage levels being present simultaneously at the first and second inputs for outputting the combination of the first and second voltage levels across said load, and is responsive to the third and fourth voltage levels being present simultaneously at the third and fourth inputs for outputting the combination of the third and fourth voltage levels across said load.

3. A class SM amplifier comprising:
a load;
a power combiner coupled to said load;
an input source having an input signal with a bandwidth and a center frequency;
threshold means having a plurality of threshold levels including first and second threshold levels, coupled to said input source and responsive to the voltage amplitude of the input signal for generating a plurality of threshold signals including first and second threshold signals;

voltage means for supplying a plurality of voltage levels including first, second and third voltage levels, wherein first voltage level is adjusted to approximate the voltage amplitude of the input signal when the voltage amplitude of the input signal crosses the first threshold level, second voltage level is adjusted to approximate the voltage amplitude of the input signal when the voltage amplitude of the input signal crosses the second threshold level, and third voltage level is adjusted to approximate the voltage amplitude of the input signal when the voltage amplitude of the input signal is between the first and second threshold levels;

a plurality of switching means, including first and second switching means, coupled to said power combiner, said threshold means and the plurality of voltage levels of said voltage means wherein said first and second switching means are responsive to the first and second threshold signals for switching the first and second voltage levels, respectively, across said power combiner; and wherein said power combiner is responsive to only the first voltage level being present at the first input for outputting the first voltage level across said load, is responsive to only the second voltage level being present at the second input for outputting the second voltage level across said load, and said power combiner outputs across said load the third voltage level in response to the first and second voltage levels not being present at the first and second inputs, respectively.

4. The class SM amplifier as set forth in claim 1, further including:

threshold means having fifth and sixth threshold levels, and responsive to the input signal crossing fifth and sixth threshold levels, for generating fifth and sixth threshold signals, respectively;

voltage means for supplying a fifth voltage level, V5, and a sixth voltage level, V6, wherein first, second plus fifth voltage levels and second, third plus sixth voltage levels are adjusted to approximate the voltage amplitude of the input signal, proximately as the voltage amplitude of the input signal crosses fifth and sixth threshold levels, respectively;

fifth switching means coupled to said power combiner, said threshold means and the fifth voltage level of said voltage means, and responsive to the fifth threshold signal from said threshold means for switching the fifth voltage level across said power combiner;

sixth switching means coupled to said power combiner, said threshold means and the sixth voltage level of said voltage means, and responsive to the sixth threshold signal from said threshold means for switching the sixth voltage level across said power combiner;

wherein the adjustments of first, second, third, fourth, fifth and sixth voltage levels increase efficiency of said class SM amplifier by having a significant portion of the input signal amplified within the bandwidth B at center frequency $f_o$ and by having minimal spectral pollution of the input signal amplified outside the bandwidth B at harmonics of the center frequnency $f_o$.

5. The class SM amplifier as set forth in claim 1, 2, or 3, wherein said first, second, third, and fourth switching means each include at least one transistor.

6. The class SM amplifier as set forth in claim 1, 2, or 3, wherein said threshold means includes a threshold circuit.

7. A class SM amplifier comprising:
a load;
a power combiner coupled to said load and having first and second inputs;
an input source having an input signal with a bandwidth B and a center frequency $f_o$;
threshold means having at least first and second threshold levels, coupled to said input source and responsive to the voltage amplitude of the input signal crossing first and second threshold levels, for generating first and second threshold signals, respectively;

voltage means for supplying at least a first voltage level, a second voltage level, and a third voltage level, wherein first voltage level is adjusted to approximate the voltage amplitude of the input signal when the voltage amplitude of the input signal is above the first threshold level, second voltage level is adjusted to approximate the voltage amplitude of the input signal when the voltage amplitude of the input signal is below the second threshold level, and third voltage level is adjusted to approximate the voltage amplitude of the input signal when the voltage amplitude of the input signal is between the first and second threshold levels;

first switching means coupled to the first input of said power combiner, said threshold means and the first voltage level of said voltage means, and responsive to the first threshold signal from said threshold means for switching the first voltage level across said power combiner;

second switching means coupled to the second input of said power combiner, said threshold means and the second voltage level of said voltage means, and responsive to the second threshold signal from said threshold means for switching the second voltage level across said power combiner; and wherein said power combiner is responsive to the first voltage level being present at the first input for outputting the first voltage level across said load, and is responsive to the second voltage level being present at the second input for outputting the second voltage level across said load.

8. A class SM amplifier comprising:
a load;
a power combiner coupled to said load and having first, second, third, and fourth inputs;
an input source having an input signal with a bandwidth B and a center frequency $f_o$;
threshold means having at least first, second, third and fourth threshold levels, and coupled to said input source and responsive to the voltage amplitude of the input signal crossing first, second, third and fourth threshold levels, for generating first, second, third and fourth threshold signals, respectively;

voltage means for supplying at least a first voltage level, a second voltage level, a third voltage level, a fourth voltage level, and a fifth voltage level, wherein the first voltage level plus the second voltage level are adjusted approximate the voltage amplitude of the input signal when the voltage amplitude of the input signal is below the first threshold level, second voltage level is adjusted to approximate the voltage amplitude of the input signal when the voltage amplitude of the input signal is between the first threshold level and the second threshold level, third voltage level is adjusted to approximate the voltage amplitude of the input signal when the voltage amplitude of the input signal is between the third threshold level and the fourth threshold level, third voltage level plus fourth voltage level are adjusted to approximate the voltage amplitude of the input signal when the voltage amplitude of the input signal is above the fourth threshold level, and fifth voltage level is adjusted to approximate the voltage amplitude of the input signal when the voltage amplitude of the input signal is between the second threshold level and third threshold level;

first switching means coupled to the first input of said power combiner, said threshold means, and the first voltage level of said voltage means, and responsive to the first threshold signal from said threshold means for switching the first voltage level across said power combiner;

second switching means coupled to the second input of said power combiner, said threshold means and the second voltage level of said voltage means, and responsive to the second threshold signal from said threshold means for switching the second voltage level across said power combiner;

third switching means coupled to the third input of said power combiner, said threshold means, and the third voltage level of said voltage means, and responsive to the third threshold signal from said threshold means for switching the third voltage level across said power combiner;

fourth switching means coupled to the fourth input of said power combiner, said threshold means and the fourth voltage level of said voltage means, and responsive to the fourth threshold signal from said threshold means for switching the fourth voltage level across said power combiner; and wherein said power combiner is responsive to the second voltage level being present at the second input for outputting the second voltage level across said load, is responsive to the third voltage level being present at the third input for outputting the third voltage level across said load, is responsive to the first and second voltage levels being present at the first and second inputs for outputting the combination of the first and second voltage levels across said load, and is responsive to the third and fourth voltage levels being present at the third and fourth inputs for outputting the combination of the third and fourth voltage levels across said load.

9. A class SM amplifier comprising:

a load;

a power combiner coupled to said load and having first, second, third and fourth inputs;

an input source having an input signal with a bandwidth B and a center frequency $f_o$;

threshold means having first, second, third and fourth threshold levels, and coupled to said input source and responsive to the voltage amplitude of the input signal crossing first, second, third and fourth threshold levels, for generating first, second, third and fourth threshold signals, respectively;

voltage means for supplying a first voltage level, a second voltage level, a third voltage level, and a fourth voltage level;

first switching means coupled to the first input of said power combiner, said threshold means and the first voltage level of said voltage means, and responsive to the first threshold signal from said threshold means for switching the first voltage level across said power combiner;

second switching means coupled to the second input of said power combiner, said threshold means and the second voltage level of said voltage means, and responsive to the second threshold signal from said threshold means for switching the second voltage level across said power combiner;

third switching means coupled to the third input of said power combiner, said threshold means and the third voltage level of said voltage means, and responsive to the third threshold signal from said threshold means for switching the third voltage level across said power combiner;

fourth switching means coupled to the fourth input of said power combiner, said threshold means and the fourth voltage level of said voltage means, and responsive to the fourth threshold signal from said threshold means for switching the fourth voltage level across said power combiner;

wherein said power combiner is responsive to the second voltage level being present at the second input for outputting the second voltage level across said load, is responsive to the third voltage level being present at the third input for outputting the third voltage level across said load, is responsive to the first and second voltage levels being present at the first and second inputs, respectively, for outputting the combination of the first and second voltage levels across said load, and is responsive to the third and fourth voltage levels being present at the third and fourth inputs, respectively, for outputting the combination of the third and fourth voltage levels across said load; and wherein second voltage level, third voltage level, the combination of first voltage level plus second voltage level, and the combination of third voltage level plus fourth voltage level, are adjusted to increase efficiency of said class SM amplifier within the bandwidth B at center frequency $f_o$ by having minimal spectral pollution of the input signal amplified outside the bandwidth B at harmonics of the center frequency $f_o$.

10. A class SM amplifier comprising:

a load;

a power combiner coupled to said load and having first, second, third and fourth inputs;

an input source having an input signal with a bandwidth B and a center frequency $f_o$;

threshold means having at least first and second threshold levels, and coupled to said input source and responsive to the voltage amplitude of the input signal crossing first and second threshold levels, for generating first and second threshold signals, respectively;

voltage means for supplying at least a first voltage level, a second voltage level, and a third voltage level;

first switching means coupled to the first input of said power combiner, said threshold means and the first voltage level of said voltage means, and responsive to the first threshold signal from said threshold means for switching the first voltage level across said power combiner;

second switching means coupled to the second input of said power combiner, said threshold means and the second voltage level of said voltage means, and responsive to the second threshold signal from said threshold means for switching the second voltage level across said power combiner;

wherein said power combiner is responsive to the first voltage level being present at the first input for outputting the first voltage level across said load, is responsive to the second voltage level being present at the second input for outputting the second voltage level across said load; and wherein first, second and third voltage levels are adjusted to increase efficiency of said class SM amplifier within the bandwidth B at center frequency $f_o$ by having minimal spectral pollution of the input signal amplified outside the bandwidth B at harmonic of the center frequency $f_o$.

11. A class SM amplifier comprising:

a load;

a power combiner coupled to said load and having first, second, third and fourth inputs;

an input source having an input signal with a bandwidth B and a center frequency $f_o$;

threshold means having at least first, second, third and fourth threshold levels, and coupled to said input source and responsive to the voltage amplitude of the input signal crossing first, second, third and fourth threshold levels, for generating first, second, third and fourth threshold signals, respectively;

voltage means for supplying at least a first voltage level, a second voltage level, a third voltage level, a fourth voltage level, and a fifth voltage level;

first switching means coupled to the first input of said power combiner, said threshold means and the first voltage level of said voltage means, and responsive to the first threshold signal from said threshold means for switching the first voltage level across said power combiner;

second switching means coupled to the second input of said power combiner, said threshold means and the second voltage level of said voltage mean, and responsive to the second threshold signal from said threshold means for switching the second voltage level across said power combiner;

third switching means coupled to the third input of said power combiner, said threshold means and the third voltage level of said voltage means, and responsive to the third threshold signal from said threshold means for switching the third voltage level across said power combiner;

fourth switching means coupled to the fourth input of said power combiner, said threshold means and the fourth voltage level of said voltage means and responsive to the fourth threshold signal from said threshold means for switching the fourth voltage level across said power combiner;

wherein said power combiner is responsive to the second voltage level being present at the second input for outputting the second voltage level across said load, is responsive to the third voltage level being present at the third input for outputting the third voltage level across said load, is responsive to the first and second voltage levels being present simultaneously at the first and second inputs for outputting the combination of the first and second voltage levels across said load, and is responsive to the third and fourth voltage levels being present simultaneously at the third and fourth inputs for outputting the combination of the third and fourth voltage levels across said load; and wherein first, second, third, fourth, and fifth voltage levels are adjusted to increase efficiency of said class SM amplifier within the bandwidth B at center frequency $f_o$ by having minimal spectral pollution of the input signal amplified outside the bandwidth B at harmonics of the center frequency $f_o$.

* * * * *

UNITED STATES PATENT AND TRADEMARK OFFICE
CERTIFICATE OF CORRECTION

PATENT NO. : 4,748,421     Page 1 of 2

DATED : May 31, 1988

INVENTOR(S) : Donald L. Schilling; David Manela; Tuvia Apelewicz

It is certified that error appears in the above-identified patent and that said Letters Patent is hereby corrected as shown below:

Figure 4 of the Drawings should be cancelled to appear as shown on the attached sheet.

Signed and Sealed this

First Day of November, 1988

Attest:

DONALD J. QUIGG

*Attesting Officer*     Commissioner of Patents and Trademarks

UNITED STATES PATENT AND TRADEMARK OFFICE
CERTIFICATE OF CORRECTION

PATENT NO. : 4,748,421                     Page 2 of 2
DATED      : May 31, 1988
INVENTOR(S): Donald L. Schilling; David Manela; Tuvia Apelewicz It is certified that error appears in the above—identified patent and that said Letters Patent is hereby corrected as shown below:

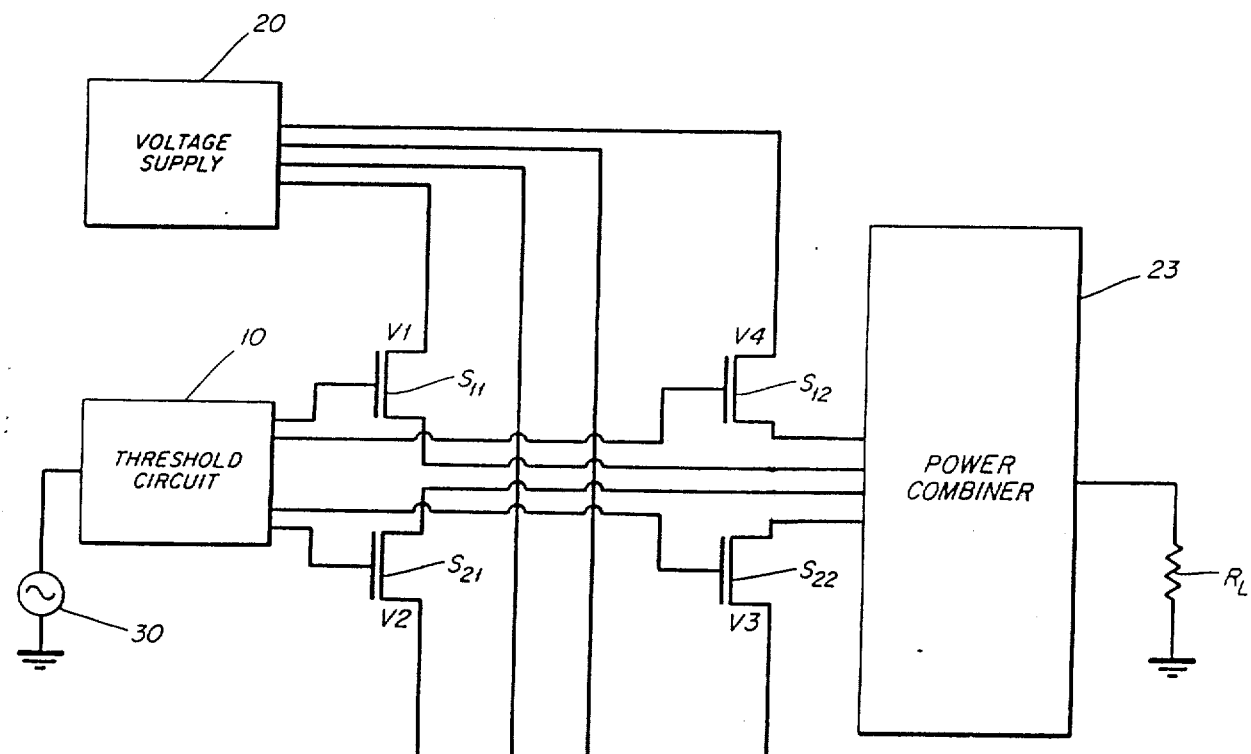

Fig. 4